United States Patent [19]

Muenzer

[11] Patent Number: 5,169,791
[45] Date of Patent: Dec. 8, 1992

[54] METHOD FOR THE PASSIVATION OF CRYSTAL DEFECTS IN POLYCRYSTALLINE SILICON MATERIAL

[75] Inventor: Adolf Muenzer, Munich, Fed. Rep. of Germany

[73] Assignee: Siemens Aktiengesellschaft, Munich, Fed. Rep. of Germany

[21] Appl. No.: 585,522

[22] Filed: Sep. 20, 1990

[30] Foreign Application Priority Data

Sep. 25, 1989 [EP] European Pat. Off. ............ 89117694

[51] Int. Cl.$^5$ ............................................. H01L 21/322
[52] U.S. Cl. ........................................ 437/13; 437/937; 437/939; 437/949; 437/980; 148/DIG. 128; 136/258
[58] Field of Search ............... 148/DIG. 24, DIG. 30, 148/DIG. 36, DIG. 125, DIG. 128; 437/937, 939, 949, 12, 13, 980; 136/258

[56] References Cited

U.S. PATENT DOCUMENTS

| | | | |
|---|---|---|---|
| 4,113,514 | 9/1978 | Pankove et al. | 357/13 |
| 4,835,006 | 5/1989 | Grasser et al. | 427/39 |

FOREIGN PATENT DOCUMENTS

| | | | |
|---|---|---|---|
| 0264762 | 4/1988 | European Pat. Off. | |
| 0117244 | 9/1980 | Japan | 437/13 |

OTHER PUBLICATIONS

Wolf, "Silicon Processing for the VLSI Era," vol. 1 pp. 198–202, 1986.
Agarwal et al., "Passivation of Defects in Polycrystalline Silicon Solar Cells by Molecular Hydrogen Annealing", Int. J. Electronics, vol. 58, No. 5, 769–779, 1985.
Okamoto et al. "Efficiency Improvement in Screen Printed Large Area Polycrystalline Silicon Solar Cell . . . ", 20th IEEE Photoroltaic Specialists Conf. Las Vegas, NV, Sep. 1988.
Pankove et al., "Hydrogenation and Dehydrogenation of Amorphous and Crystalline Silicone", Appl. Phys. Lett., 32(7), Apr. 1, 1978, pp. 439–441.
Mimila-Arroyo et al., "Enhancement of Minority Carrier Diffusion Length in Grains of Cast S: by Hydrogen Heat Treatments", Conference Record, 15th IEEE Photorolataic Specialists Conf. Kissimmee, Fl., May 12–15, 1981 Aug. 1981, pp. 259–260.
Seager et al., "The Electronic Structure and Passivation of Grain Boundaries . . . ", J of Electrochem. Soc. Reviews and News, Mar. 1980, p. 112.
Ghandhi, "VLSI Fabrication Principles", 1983 John Wiley & Sons Inc., pp. 377–378.
Johnson et al., "Low Temperature Annealing and Hydrogenation of Defects at the Si–SiO$_2$ Interface", J. Vac. Sci. Technol., 19(3), Sep./Oct. 1981, pp. 390–394.
Hansen et al., "Bulk Acceptor Components Produced in P–Type Silicon at Near-Ambient Temperatures by a H$_2$O Plasma", Appl. Phys. Lett. 44(6), Mar. 15, 1984, pp. 606–608.
W. Schmidt et al., Improved Efficiencies of Semiconductor and Metallurgical Grade Cast Silicon Solar Cells by Hydrogen Plasma Treatment, IEEE 1982, pp. 537–542.
A. Agarwall et al., Passivation of Defects in Polycrystalline Silicon Solar Cells by Molecular Hydrogen Annealing Int. J. Electronics, 1985, vol. 58, No. 5, pp. 769–774.
Aitken et al., Wet Forming Gas Anneal To Remove Radiation Damage From Polysilicon Gate MOSFETS IBM vol. 25 No. 3B Aug. 1982.
L. Ammor et al., Improvement of Polycrystalline Silicon Wafers and Solar Cells by Annealing in Hydrogen Gas Flow 1046B Extended Abstracts, 86–1 (1986) May, No. p. 460.

*Primary Examiner*—Olik Chaudhuri
*Assistant Examiner*—Ourmazd S. Ojan
*Attorney, Agent, or Firm*—Hill, Van Santen, Steadman & Simpson

[57] ABSTRACT

A method for the passivation of crystal defects in polycrystalline or amorphous silicon material using a temperature treatment step in a hydrogen-containing atmosphere the method results in favorable diode properties and favorable passivation properties in amorphous or, respectively, polycrystalline silicon material in a simple manner. Hydrogen-oxygen compounds are reduced at the surface of the silicon material, creating atomic hydrogen that diffuses into the silicon material.

6 Claims, 1 Drawing Sheet

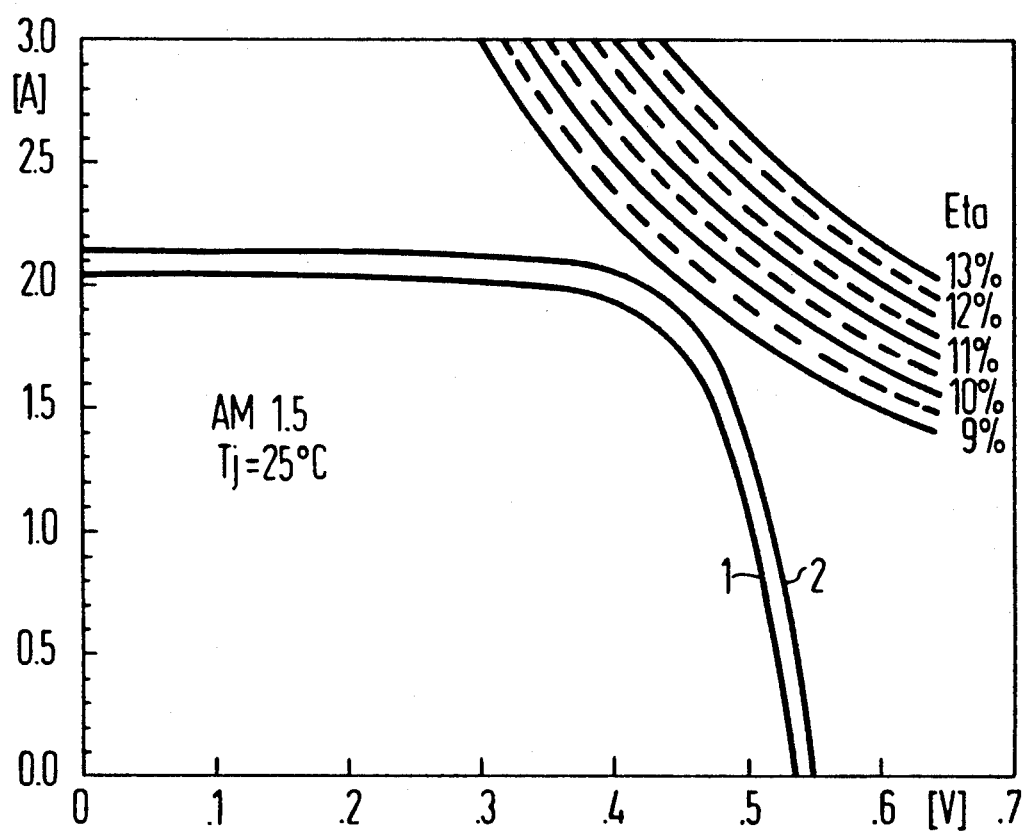

METHOD FOR THE PASSIVATION OF CRYSTAL DEFECTS IN POLYCRYSTALLINE SILICON MATERIAL

BACKGROUND OF THE INVENTION

The present invention is directed to a method for the passivation of crystal defects in polycrystalline or amorphous silicon material using a method that includes a heating step in a hydrogen-containing atmosphere.

It is known to use silicon material, such as polycrystalline silicon wafers, silicon layers, and silicon materials of arbitrary shapes, to make electronic components. These materials, however, typically include crystal defects such as, for example, point defects or line defects, and offsets or drain boundaries. These crystal defects result in the electronic components manufactured from such silicon material having a diminished quality. For example, solar cells or photodiodes that are constructed from a silicon material having a crystal defect exhibit diminished photocurrent sensitivities and no-load voltages as a consequence of increased recombination currents. Unfavorable diode properties occur using such silicon materials.

Methods, typically referred to as "grain boundary passivation", have been suggested for reducing the effect of these crystal defects. Examples of such methods for reducing the influences of crystal defects include:

a) Implantation of ionized hydrogen atoms: J. E. Johnson, J. I. Hano Ka, and J. A. Gregory, 18. IEEE Photovoltaic Specialists Conference, Las Vegas 1985, pages 1112-1115;

b) Treatment with a hydrogen plasma: W. Schmidt, K. D. Rasch, and K. Roy: 16. IEEE Photovoltaic Specialists Conference, San Diego, 1982, pages 537-542, U.S. Pat. No. 4,835,006; and c) Temperature treatment in a hydrogen atmosphere: A. Agarwal, D. Bana, and C. M. Singal: Int. I. Electr. 1985, Vol. 58, No. 5, pages 769-774.

SUMMARY OF THE INVENTION

The present invention provides a method for the passivation of crystal defects in polycrystalline or amorphous silicon material using a temperature treatment step in a hydrogen-containing atmosphere. The method provides favorable diode properties and/or favorable passivation properties in amorphous or, respectively, polycrystalline silicon material in a simple manner.

To this end, pursuant to the method of the present invention, the passivation of crystal defects in polycrystalline or amorphous silicon material is achieved using a temperature treatment step in a hydrogen-containing atmosphere wherein hydrogen-oxygen containing compounds are reduced at the surface of the silicon material. Atomic hydrogen is created that diffuses into the silicon material during the method.

In an embodiment of the method, the temperature treatment step is performed at a temperature range of between 250° C, to about 500° C.

In an embodiment of the method, water is used as the hydrogen-oxygen containing compound.

In an embodiment of the method, the method is performed at a pressure that is greater than ambient pressure.

Additional features and advantages of the present invention are described in, and will be apparent from, the detailed description of the presently preferred embodiments and from the drawing.

BRIEF DESCRIPTION OF THE DRAWING

The Figure illustrates the I-U characteristics of polycrystalline solar cells without an antireflection coat before and after the method of the present invention.

DETAILED DESCRIPTION OF THE PRESENTLY PREFERRED EMBODIMENTS

The present invention is directed to the passivation of crystal defects in amorphous silicon material or polycrystalline material. The amorphous silicon material can be used for solar cells, photodiodes, as well as for electrographic recording material.

Pursuant to the method of the present invention, the silicon material is heated in a hydrogen-containing atmosphere in the presence of hydrogen-oxygen containing compounds that are reduced at the surface of the silicon material. Atomic hydrogen is created that diffuses into the silicon material.

Pursuant to the present invention, the passivation of grain boundaries and of inner-grain defects in the silicon material proceeds by saturating these crystal defects with hydrogen atoms. To accomplish the saturation of the defects with hydrogen, two steps for generating atomic hydrogen and for transporting it to the crystal defect are necessary. In order to achieve an optimally non-destructive transport of the generated hydrogen atoms to the crystal defect, a diffusion process is most suitable.

Pursuant to the present invention, in order to produce hydrogen atoms, hydrogen-oxygen containing compounds, for example water, are reduced at the surface of the silicon. Hydrogenous compounds whose dissociation energies are lower at defined temperatures than the bonding energy of silicon dioxide ($SiO_2$) are suitable for this purpose. As a consequence of the reduction of the hydrogen-oxygen compounds at the surface of the silicon material, atomic hydrogen is created. The atomic hydrogen is driven into the silicon material to the crystal defects at an appropriate temperature.

By way of example, and not limitation, in an embodiment of the present invention, the polycrystalline silicon wafers are heated in a water-containing atmosphere. It has been found that a temperature range of between approximately 250° C. to about 500° C. functions satisfactory for the purposes of the present invention. The solar cells created from silicon material treated in this manner exhibit improvements in the short-circuit current, no-load voltage, and filling factors.

Referring now to the Figure, the Figure illustrates current-voltage characteristics of polycrystalline solar cells before and after treatment by the method of the present invention in a water-containing atmosphere. In the Figure, curve 1 illustrates the current-voltage characteristics of polycrystalline solar cells without antireflection coating before the temperature treatment of the present invention. Curve 2 illustrates the current-voltage characteristics of the same polycrystalline solar cell without an antireflection coat after a temperature treatment of the present invention at 330° C. in a water-containing atmosphere for passivation of the crystal defects. A comparison of curves 1 and 2 of the Figure clearly demonstrates the improvement achieved by the present invention with respect to the solar cell parameters of "short-circuit" and "no-load voltage".

The method of the present invention can be performed at ambient pressure. However, the method of the present invention, in an embodiment, can also be performed at elevated pressure in order to achieve a higher passivation effect.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

I claim:

1. A method for the passivation of crystal defects in polycrystalline or amorphous silicon material, comprising the step of:

reducing a compound comprising a hydrogen-oxygen-bond at a surface of the silicon material causing atomic hydrogen to be created that diffuses into the silicon material, the reduction step being performed at a temperature of between approximately 250° C. to about 500° C.

2. The method of claim 1 wherein water is used as the hydrogen-oxygen compound.

3. The method of claim 1 wherein the pressure of an environment containing the bonded hydrogen atmosphere is greater than ambient pressure.

4. A method for the passivation of crystal defects in silicon material comprising the steps of reducing a hydrogen-oxygen containing compound at a surface of a silicon material and causing hydrogen to be created that diffuses into the silicon material, the reduction step being performed at a temperature of between approximately 250° C. to about 500° C.

5. The method of claim 4 wherein water is used as the hydrogen-oxygen containing compound.

6. The method of claim 4 wherein the pressure of an environment containing the bonded hydrogen atmosphere is greater than ambient pressure.

* * * * *